(12) United States Patent
Chou et al.

(10) Patent No.: US 10,893,608 B2
(45) Date of Patent: Jan. 12, 2021

(54) FABRIC HAVING MULTIPLE LAYERED CIRCUIT THEREON INTEGRATING WITH ELECTRONIC DEVICES

(71) Applicant: National Taipei University of Technology, Taipei (TW)

(72) Inventors: Tzu-Wei Chou, Taipei (TW); Syang-Peng Rwei, Taipei (TW); Chien-Cheng Chen, Taipei (TW); Guo-Ming Sung, Taipei (TW)

(73) Assignee: National Taipei University of Technology, Taipei (TW)

( * ) Notice: Subject to any disclaimer, the term of this patent is extended or adjusted under 35 U.S.C. 154(b) by 0 days.

(21) Appl. No.: 16/105,900

(22) Filed: Aug. 20, 2018

(65) Prior Publication Data

US 2019/0069407 A1    Feb. 28, 2019

(30) Foreign Application Priority Data

Aug. 25, 2017   (TW) .............................. 106128896 A

(51) Int. Cl.
*H05K 1/00* (2006.01)
*H05K 1/11* (2006.01)
(Continued)

(52) U.S. Cl.
CPC .............. *H05K 1/118* (2013.01); *B33Y 80/00* (2014.12); *H05K 1/0281* (2013.01); *H05K 1/032* (2013.01);
(Continued)

(58) Field of Classification Search
CPC ...... H05K 1/118; H05K 1/0281; H05K 1/038; H05K 1/032; H05K 1/092; H05K 1/115;
(Continued)

(56) References Cited

U.S. PATENT DOCUMENTS 4,677,252 A  *  6/1987  Takahashi .............. H05K 1/056
                                                        174/254
6,729,025 B2 *  5/2004  Farrell ...................... B32B 3/08
                                                         29/825

(Continued)

FOREIGN PATENT DOCUMENTS

CN          102057763          5/2011

OTHER PUBLICATIONS

Feb. 7, 2020—CN OA (the OA document is attached in Chinese).

*Primary Examiner* — Pete T Lee
(74) *Attorney, Agent, or Firm* — IPR Works LLC

(57) ABSTRACT

The present invention provides a fabric having a multiple layered circuit thereon integrating with electronic devices. The fabric comprises: a base layer; a plurality of conductive circuit layers; at least one connecting layer having electrically-conductive via-hole(s) and electrically-insulated area covering the area without the via-hole(s) and electrically connecting two conductive circuit layers through the via-hole(s) but electrically insulating the rest of the two conductive circuit layers; one or more than one electrical devices mounted to the conductive circuit layer and connected to circuits on the conductive circuit layer through anisotropic conductive film (ACF); and a water-proof layer disposed on the conductive circuit layer which is the farthest away from the base layer and covering the electrical device(s).

17 Claims, 6 Drawing Sheets

(51) Int. Cl.

| | | |
|---|---|---|
| *H05K 1/03* | (2006.01) | |
| *H05K 1/18* | (2006.01) | |
| *H05K 3/32* | (2006.01) | |
| *H05K 3/46* | (2006.01) | |
| *B33Y 80/00* | (2015.01) | |
| *H05K 1/02* | (2006.01) | |
| *H05K 1/09* | (2006.01) | |
| *H05K 3/12* | (2006.01) | |
| *H05K 3/28* | (2006.01) | |

(52) U.S. Cl.
CPC ............ *H05K 1/038* (2013.01); *H05K 1/092* (2013.01); *H05K 1/115* (2013.01); *H05K 1/189* (2013.01); *H05K 3/125* (2013.01); *H05K 3/1216* (2013.01); *H05K 3/1241* (2013.01); *H05K 3/285* (2013.01); *H05K 3/323* (2013.01); *H05K 3/4664* (2013.01); *H05K 3/284* (2013.01); *H05K 2201/0129* (2013.01); *H05K 2201/0154* (2013.01); *H05K 2201/068* (2013.01); *H05K 2201/10106* (2013.01); *H05K 2201/10151* (2013.01); *H05K 2203/068* (2013.01)

(58) Field of Classification Search
CPC ........... H05K 1/189; H05K 2201/0129; H05K 2201/0154; H05K 2201/068; H05K 2201/10106; H05K 2201/10151; H05K 2203/068
See application file for complete search history.

(56) References Cited

U.S. PATENT DOCUMENTS

| | | | |
|---|---|---|---|
| 2002/0076948 | A1 | 6/2002 | Farrell et al. |
| 2010/0206614 | A1* | 8/2010 | Park ........................ H01H 13/88 174/126.1 |
| 2011/0100683 | A1* | 5/2011 | Bhattacharya ......... H05K 1/038 174/254 |
| 2013/0043067 | A1* | 2/2013 | Hayashi .................. B32B 5/022 174/258 |
| 2014/0014403 | A1* | 1/2014 | Miller .................. H05K 1/0281 174/260 |
| 2014/0070957 | A1* | 3/2014 | Longinotti-Buitoni ..................... G06F 3/011 340/870.01 |

* cited by examiner

FABRIC HAVING MULTIPLE LAYERED CIRCUIT THEREON INTEGRATING WITH ELECTRONIC DEVICES

BACKGROUND OF THE INVENTION a. Field of the Invention

The invention relates to a fabric having a multiple layered circuit thereon, particular to a fabric having a multiple layered circuit thereon integrating with electronic devices.

b. Description of the Related Art

The smart wear or smart accessory by incorporating electronic products to fabrics has become a rapidly emerging textile product, which has gradually attracted attention and research and development in the textile industry. A textile product incorporating various electronic devices in a fabric can be for example a warning cloth incorporating a light-emitting diode, an insole incorporating a motion sensor, a heating cloth combining with a heating circuit, and a sports-wear incorporating a heart rate sensor, etc.

U.S. Pat. No. 8,003,198 discloses a conductive fabric comprising a base layer composed of fibers, a conductive circuit layer formed on the base layer, and an insulating layer protecting the conductive circuit layer. However, it is focused mainly on the insulating layer to maintain the resistance of the conductive circuit layer before and after washing without significant change and the width of the conductive circuit layer is in the range of 10 mm to 20 mm. The problem of the short circuit and poor appearance of the incorporation of the electronic devices and fine circuits with the elastic and flexible fabric shows no specific solution in the prior art.

Furthermore, Taiwan patent No. 1337937 discloses a method for producing an elastic conductive cloth by adhering a foamed resin to a surface of a cloth, then forming a film on the foamed resin, and then plating the film to metallize the cloth, but there is no disclosure about a conductive layer with a pattern and about a conductive cloth incorporated with electronic devices.

Furthermore, Taiwan patent No. 1362324 discloses a method for manufacturing a conductive cloth and a finished product thereof, which mainly utilizes a fixing device to incorporate a first flexible substrate, a second flexible substrate and a conductive yarn between the first and second flexible substrates by dot-like fixation points to achieve a method for quickly manufacturing a conductive cloth and a finished product. However, there is no disclosure about a conductive cloth with electronic devices.

Taiwan patent publication No. 201723250 discloses a fabric structure for electrically connecting electronic components, using an anisotropic conductive adhesive to bond a flexible circuit board to a film (as a fabric in a fabric structure). The first circuit layer on the fabric is connected to the second circuit layer of the flexible circuit board, but the multilayer conductive circuit on the fabric is not disclosed and the configuration of directly arranging the chip or the die on the cloth is not disclosed. How to solve the matching problem of various elastic and flexible materials is also not mentioned.

BRIEF SUMMARY OF THE INVENTION

In light of the above background, in order to fulfill the requirements of the industry, one object of the invention provides a fabric having a multiple layered circuit thereon integrating with an electronic device to achieve the purpose of combining a variety of electronic components with a soft (multi-directional or arbitrarily flexible or bendable) film or fabric to provide various functions to be used as a switch, a keyboard, a touch panel, and the like. For example, a keyboard that conventionally uses a flexible circuit board (FPC) can be wound into a roll only in one direction, but it still has a considerable thickness and has only one single winding direction. Furthermore, according to the fabric having the multiple layered circuit thereon integrating with the electronic device of the present invention, it is possible to provide a fabric having electronic devices which is flexible, bendable and stretchable which cannot be provided by a conventional FPC. On the other hand, the fabric of the present invention can have the spacer fabric coated with thermoplastic resins as a base layer and the multiple layered circuits on the base layer to be applied in the medical application. For example, it can be used as the fixation device for bone fracture or the support device for spine. The multiple layered circuits can be utilized to provide electrical pulses, magnetic pulses or ultrasound to assist bone growth.

Another object of the invention provides a method for fabricating a fabric having a multiple layered circuit thereon integrating with an electronic device to solve the problems of, for example, short circuit and poor appearance of the electronic components and fine circuits incorporated with the elastic or flexible fabric; short circuit between the flexible printed circuit and the conductive circuit layer when using the electronic device including the flexible printed circuit and the chip or die; and allocation of complicate conductive circuit layers.

On the other hand, according to the method for fabricating a fabric having a multiple layered circuit thereon integrating with an electronic device, a sticker type fabric having a multiple layered circuit thereon integrating with an electronic device can be fabricated and can be transferred to a desired location.

Other objects and advantages of the invention can be better understood from the technical characteristics disclosed by the invention. In order to achieve one of the above purposes, all the purposes, or other purposes, one embodiment of the invention provides a fabric having a multiple layered circuit thereon integrating with an electronic device, comprising: a base layer; a plurality of conductive circuit layers, formed on the base layer; at least one connecting layer, comprising a plurality of via-holes made of a conductive material and a plurality of electrically insulated regions made of an insulating material and being positioned between any two adjacent conductive circuit layers of the plurality of conductive circuit layers wherein the via-holes electrically connect the two adjacent conductive circuit layers and the electrically insulated regions are distributed in the areas other than the via-holes of the connecting layer; at least one electronic device, mounted on and electrically connected to the circuit of the conductive circuit layer through anisotropic conductive film; and a waterproof layer, formed on the conductive circuit layer be farthest away from the base layer; wherein the absolute value of the difference between the thermal expansion coefficient of the material constituting the conductive circuit layer and the thermal expansion coefficient of the insulating material constituting the electrically insulated region of the connecting layer is less than 20% of the insulating material; and the absolute value of the difference between the thermal expansion coefficient of the insulating material of the connecting layer and the thermal expansion coefficient of the conductive material of the connecting layer is less than 20% of the thermal expansion coefficient of the insulating material of the connecting layer; the absolute value of the difference between the thermal expansion coefficient of the anisotropic conductive film and the thermal expansion coefficient of the insulating material of the connecting layer is less than 20% of the insulating material of the connecting layer.

Furthermore, one other embodiment of the invention provides a method for fabricating a fabric having a multiple layered circuit thereon integrating with an electronic device, comprising the following steps: (1) providing a base layer; (2) forming a conductive circuit layer having a first designed pattern on the base layer; (3) forming a connecting layer on the conductive circuit layer having the first designed pattern; (4) forming a conductive circuit layer having a second designed pattern on the connecting layer and mounting at least one electronic device on a circuit of the conductive circuit layer having the second designed pattern through anisotropic conductive film; and (5) forming a waterproof layer; wherein the steps (2) and (3) are conducted at least once or after conducting the steps (2) and (3) twice or more than twice, the step (4) is conducted; and if there are more than one first designed pattern, that is, the step (2) is conducted twice or more than twice, the first designed patterns can be the same or different.

One other embodiment of the invention provides method for fabricating a fabric having a multiple layered circuit thereon integrating with an electronic device, comprising the following steps: (1) providing a separating film or paper; (2) forming a conductive circuit layer having a first designed pattern on the separating film or paper; (3) forming a connecting layer on the conductive circuit layer having the first designed pattern; (4) forming a conductive circuit layer having a second designed pattern on the connecting layer and mounting at least one electronic device on a circuit of the conductive circuit layer having the second designed pattern through anisotropic conductive film; (5) forming a waterproof layer at least to cover a region having the conductive circuit layers, the electronic device and the connecting layer to obtain a laminate containing the electronic device; and (6) adhering the laminate to an object by thermal transfer to obtain a fabric having a multiple layered circuit thereon integrating with an electronic device; wherein the steps (2) and (3) are conducted at least once or after conducting the steps (2) and (3) twice or more than twice, the step (4) is conducted.

According to the fabric having a multiple layered circuit thereon integrating with an electronic device and the method for fabricating the same of the present invention, a flexible, bendable and elastic fabric equipped with electronic devices which cannot be provided using a flexible printed circuit can be provided and besides a sticker type fabric having a multiple layered circuit thereon integrating with an electronic device can be provided and can be transferred to a desired location.

Other objectives, features and advantages of the invention will be further understood from the further technological features disclosed by the embodiments of the invention wherein there are shown and described preferred embodiments of this invention, simply by way of illustration of modes best suitable to carry out the invention.

DETAILED DESCRIPTION OF THE INVENTION

Figure 1:
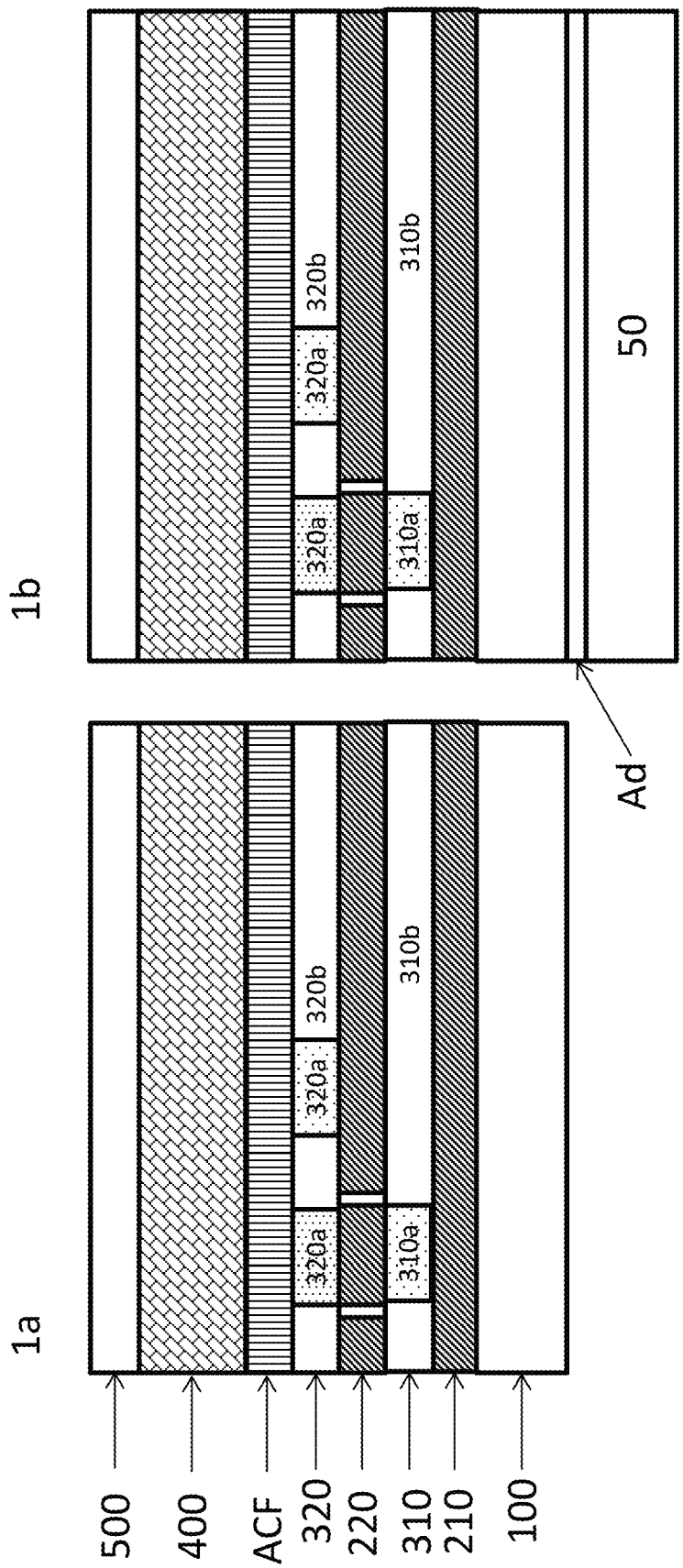
FIG. 1 shows a cross-sectional schematic diagram illustrating a portion of a fabric having a multiple layered circuit thereon integrating with an electronic device according to one embodiment of the invention.

In the following detailed description of the preferred embodiments, reference is made to the accompanying drawings which form a part hereof, and in which are shown by way of illustration specific embodiments in which the invention may be practiced. The drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The common structures and elements that are known to everyone are not described in details to avoid unnecessary limits of the invention. In the following examples, the description of the direction, such as upper, lower, left, right, front or rear, etc., is referred to the direction of the drawing. Besides, the meaning of "A layer (or element) is on B layer (element)" includes, but not limited to, "A layer is directly laminated and contact with B layer". For example, a layer (C layer) may be existed between A layer and B layer. Some preferred embodiments of the present invention will now be described in greater detail in the following.

Figure 2:
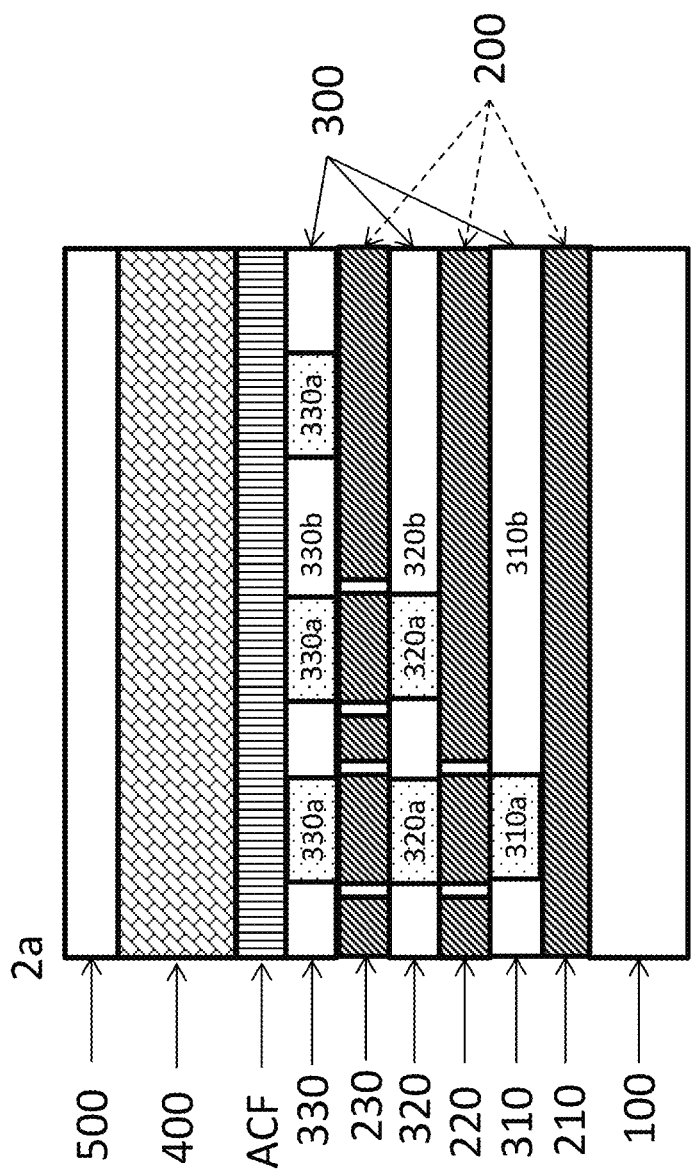
FIG. 2 shows a cross-sectional schematic diagram illustrating a portion of a fabric having a multiple layered circuit thereon integrating with an electronic device according to another embodiment of the invention.

Referring to FIGS. 1 and 2, cross-sectional schematic diagrams illustrating a portion of a fabric having a multiple layered circuit thereon integrating with an electronic device of the present invention are shown. As shown in FIG. 1 and FIG. 2, the fabric of the invention 1a includes: a base layer 100, a conductive circuit layer 200 (including conductive circuit layers 210, 220, and 230), and a connecting layer 300 (including connecting layers 310, 320 and 330), the electronic component 400, and the waterproof layer 500. The difference between the fabric 1b and the fabric 1a is that the fabric 1b further includes an adhesive layer Ad and a protective film 50 for temporarily protecting the adhesive layer Ad. Specifically, the protective film 50 is, for example, a polyethylene terephthalate (PET) film having a thickness of 25 to 200 μm. The difference between the fabric 2a shown in FIG. 2 and the fabric 1a is that the fabric 2a includes more conductive circuit layers and more connecting layers.

The connecting layers 310, 320 and 330 have a plurality of via-holes 310a, 320a, and 330a composed of a conductive material and a plurality of insulating regions 310b, 320b, and 330b composed of an insulating material, and the connecting layer is located between any two adjacent conductive circuit layers which are electrically connected through the via-holes 310a, 320a and 330a. The insulating regions 310b, 320b and 330b are distributed in the areas of the connecting layer except the area of the via-holes.

The electronic device 400 (only one electronic device is shown in the drawing and may have other electronic components at other positions of the fabric) is mounted on the conductive circuit layer by the anisotropic conductive film (ACF) and is electrically connected to the circuit of the conductive circuit layer to function accordingly.

The waterproof layer 500 covers the area covered by the electronic device and the conductive circuit layer to achieve the functions of waterproofing, heat conduction, and moisture permeability. The material constituting the waterproof layer 500 is, for example, a thermoplastic resin, polytetrafluoroethylene, a silicone resin, or the like. Specifically, for example, it is thermoplastic polyester, thermoplastic polyurethane or the like, and is preferably thermoplastic polyurethane (for example a hot-melt polyurethane rubber).

In one embodiment, the electronic device comprises a flexible circuit board and a chip or die on the flexible circuit board. When the electronic device comprises a flexible circuit board, the fabric can further comprise a reinforcing insulating plate, positioned between the flexible circuit board and the conductive circuit layer. The reinforcing insulating plate can be made of polyimide. For example, the reinforcing insulating plate is a polyimide film having a thickness of 8-200 μm.

In one embodiment, the electronic device is a light emitting diode or a sensor.

In one embodiment, the base layer is a woven fabric, knit fabric, spacer fabric or thermoplastic film having one or two of its main surfaces be waterproof. The conductive circuit layer 200 can be formed on any waterproof surface. When the base layer is a thermoplastic film, the thermoplastic film usually has the functions of waterproofing, heat conduction, and moisture permeability. That is, the thermoplastic film has two waterproof surfaces.

In order to secure the normal operation of the electronic device and the circuits on the conductive circuit layers, the absolute value of the difference between the thermal expansion coefficient of the material constituting the conductive circuit layer and the thermal expansion coefficient of the insulating material constituting the electrically insulated region of the connecting layer is less than 20% of the insulating material, preferably less than 4% and more preferably less than 1%. The absolute value of the difference between the thermal expansion coefficient of the insulating material constituting the electrically insulated region of the connecting layer and the thermal expansion coefficient of the conductive material of the connecting layer is less than 20% of the thermal expansion coefficient of the insulating material constituting the electrically insulated region, preferably less than 4% and more preferably less than 1%. The absolute value of the difference between the thermal expansion coefficient of the anisotropic conductive film (ACF) and the thermal expansion coefficient of the insulating material of the connecting layer is less than 20% of the insulating material, preferably less than 4% and more preferably less than 1%.

The anisotropic conductive film has a bonding temperature between 100 and 140° C. and has the characteristic of quick bonding. For example, the bonding takes about 5-10 sec. ACF can be purchased and for example can be obtained from companies such as Hitachi, Dexirels, or U-PAK co.

In one embodiment, the conductive circuit layer is made of conductive silver paste. For example, the silver paste, being capable of stretching, distortion and bending (elongation ≥100%) and having a conductivity coefficient of about 100 μΩ·cm can be used in screen printing. The silver paste can be dried at a low temperature. The low temperature is, for example, about 120~150° C. The thickness of the conductive circuit layer is, for example, about 12~200 μm, and preferably 12~50 μm.

Figure 3:
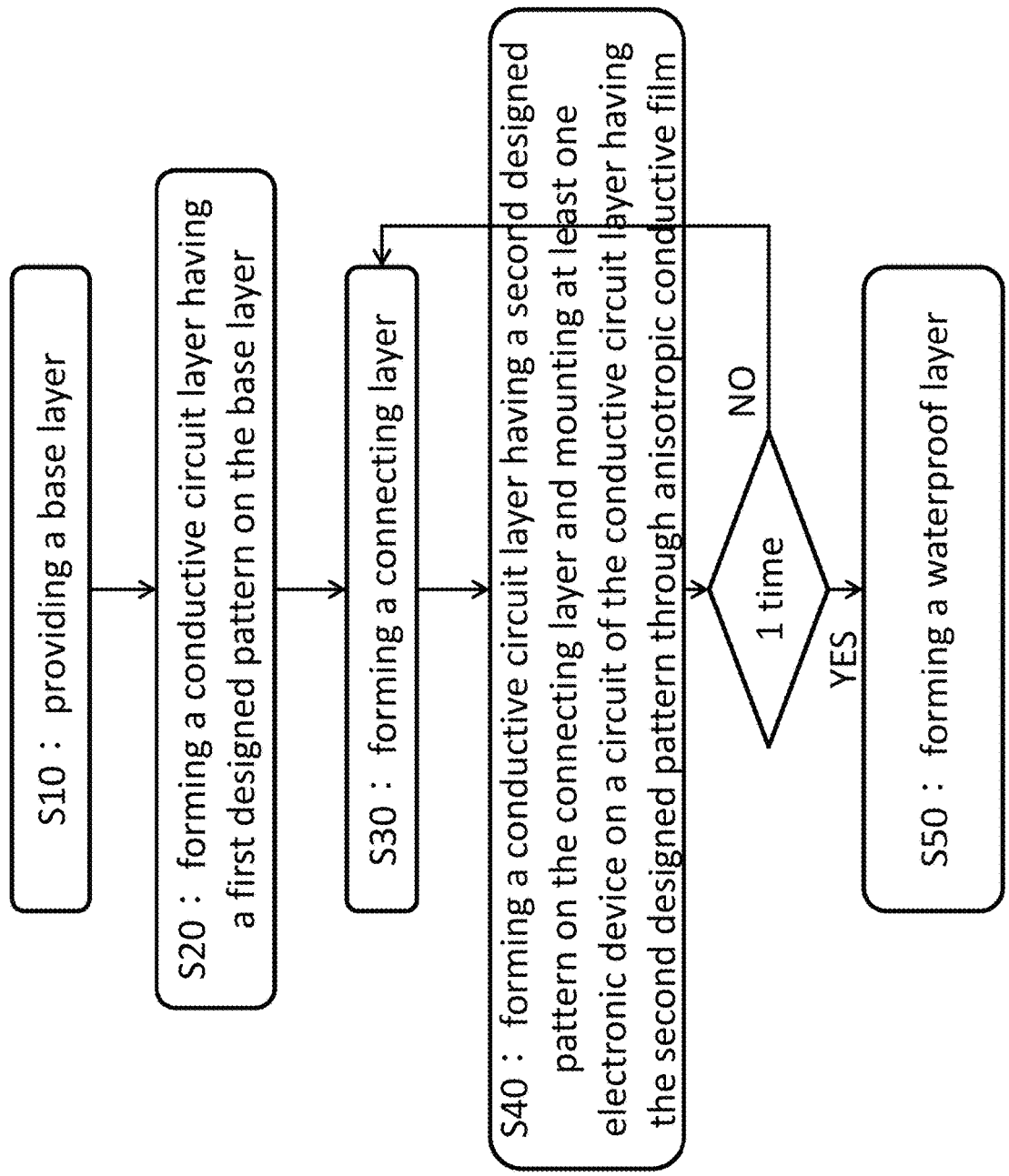
FIG. 3 shows a flow chart of the method for fabricating a fabric having a multiple layered circuit thereon integrating with an electronic device according to one embodiment of the invention.
Figure 4:
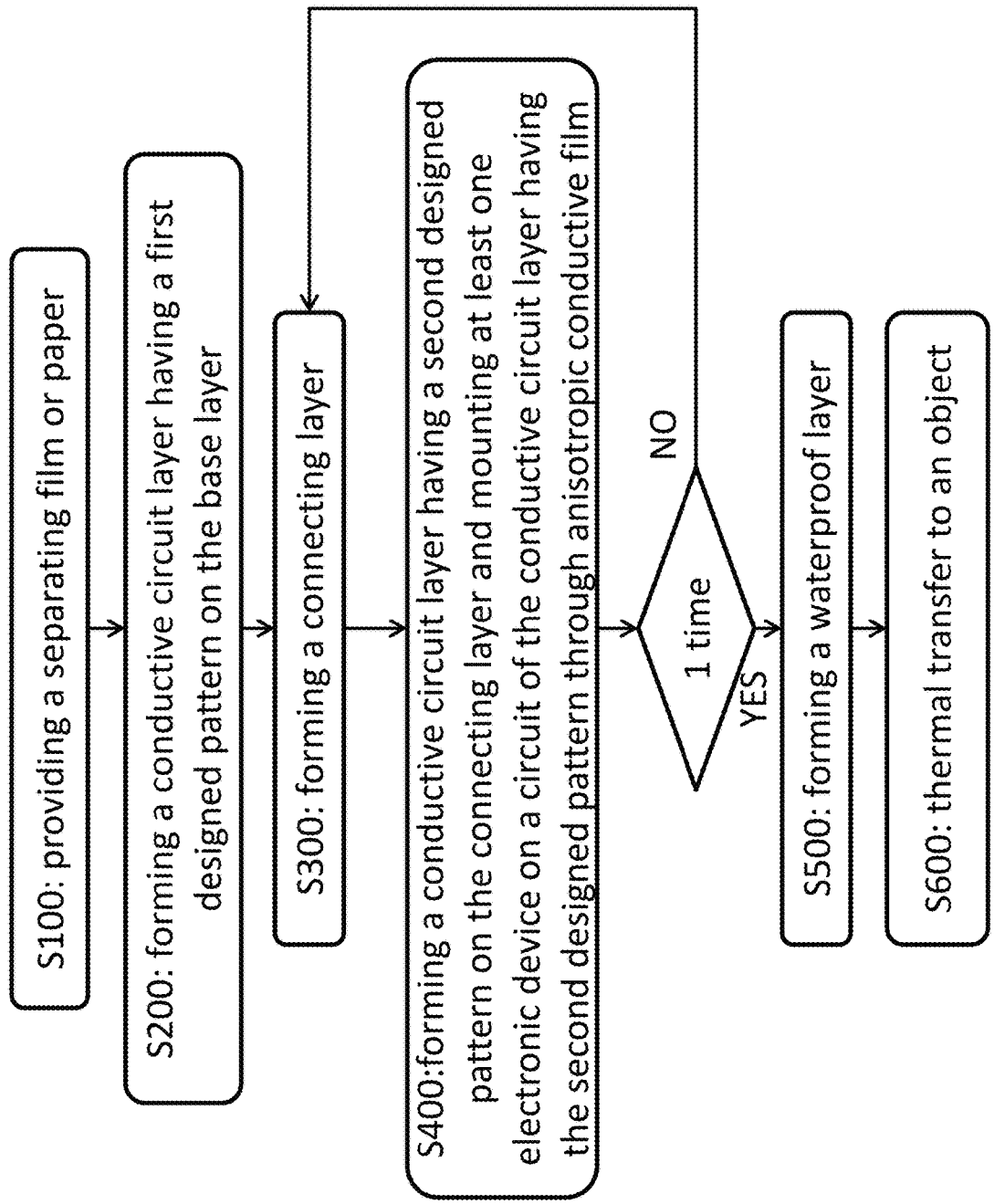
FIG. 4 shows a flow chart of the method for fabricating a fabric having a multiple layered circuit thereon integrating with an electronic device according to another embodiment of the invention.

FIGS. 3 and 4 show flow charts of the method for fabricating a fabric having a multiple layered circuit thereon integrating with an electronic. As shown in FIG. 3, the method of the present invention comprises the following steps: (1) providing a base layer (S10); (2) forming a conductive circuit layer having a first designed pattern on the base layer (S20); (3) forming a connecting layer on the conductive circuit layer having the first designed pattern (S30); (4) forming a conductive circuit layer having a second designed pattern on the connecting layer and mounting at least one electronic device on a circuit of the conductive circuit layer having the second designed pattern through anisotropic conductive film (S40); and (5) forming a waterproof layer (S50); wherein the steps (2) and (3) are conducted at least once or after conducting the steps (2) and (3) twice or more than twice, the step (4) is conducted; and if there are more than one first designed pattern, that is, the step (2) is conducted twice or more than twice, the first designed patterns can be the same or different. The base layer is a woven fabric, knit fabric, spacer fabric or thermoplastic film having one or two of its main surfaces be waterproof.

As shown in FIG. 4, the method of the present invention comprises the following steps: (1) providing a separating film or paper (S100); (2) forming a conductive circuit layer having a first designed pattern on the separating film or paper (S200); (3) forming a connecting layer on the conductive circuit layer having the first designed pattern (S300); (4) forming a conductive circuit layer having a second designed pattern on the connecting layer and mounting at least one electronic device on a circuit of the conductive circuit layer having the second designed pattern through anisotropic conductive film (S400); (5) forming a waterproof layer at least to cover a region having the conductive circuit layers, the electronic device and the connecting layer to obtain a laminate containing the electronic device (S500); and (6) adhering the laminate to an object by thermal transfer to obtain a fabric having a multiple layered circuit thereon integrating with an electronic device (S600); wherein the steps (2) and (3) are conducted at least once or after conducting the steps (2) and (3) twice or more than twice, the step (4) is conducted. The object is a woven fabric, knit fabric, spacer fabric or thermoplastic film having one or two of its main surfaces be waterproof.

In one embodiment, in the step (2) forming a conductive circuit layer having a first designed pattern (S20, S200) is to use silver paste to form the first designed pattern by dispensing or screen printing.

In one embodiment, in the step (3) forming a connecting layer (S30, S300) is to use a three-dimensional printer to print the conductive material and insulating material simultaneously to form via-holes and electrically insulated regions wherein the via-holes electrically connect the two adjacent conductive circuit layers and the electrically insulated regions are distributed in the areas other than the via-holes of the connecting layer. The conductive material can be silver paste or low-temperature solder paste. The silver paste can be similar to the above mentioned silver paste. The "low temperature" of the low-temperature solder paste means for example 120~160° C.

In another embodiment, in the step (3) forming a connecting layer is to use an inkjet printing, screen printing, or dispensing method, or a coating method using a mask to form a plurality of electrically insulated regions constituted by insulating material and then to use an inkjet printing, screen printing, or dispensing method to form a plurality of via-holes constituted by silver paste or low temperature solder paste. The conductive material can be silver paste or low-temperature solder paste. The silver paste can be similar to the above mentioned silver paste. The "low temperature" of the low-temperature solder paste means for example 120~160° C.

In one embodiment, in the step (4) (S40, S400) silver paste is dispensed or screen printed to form the conductive circuit layer and an anisotropic conductive film has low bonding temperature is used to mount the electronic device on the conductive circuit layer through thermal press.

In the method of the present invention, the electronic device comprises a flexible circuit board and a chip or die on the flexible circuit board. During the thermal press, a reinforcing insulating plate 51 can be placed between the flexible circuit board and the conductive circuit layer. The electronic device can only include a chip or die. The example of the chip or die includes a light emitting diode or a sensor.

Figure 5:
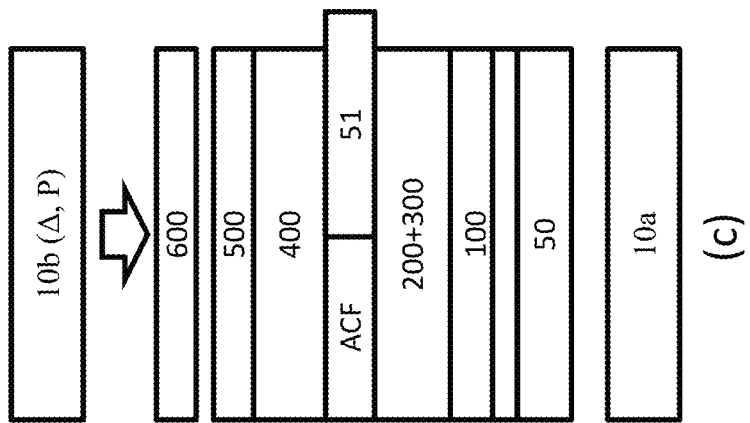
FIG. 5 shows a schematic diagram illustrating the thermal press in the step (4) of the method for fabricating a fabric having a multiple layered circuit thereon integrating with an electronic device according to one embodiment of the invention.
Figure 5:
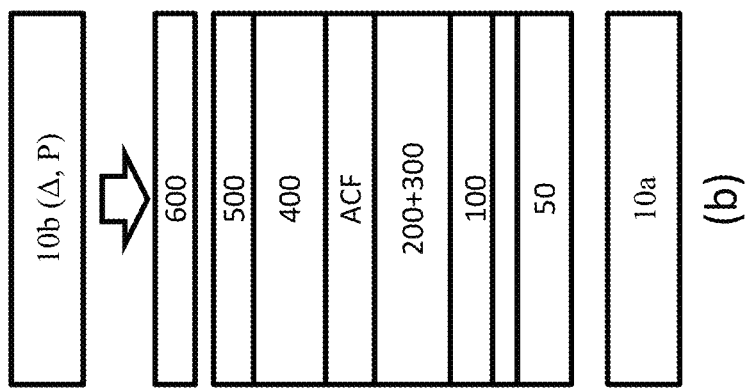
Figure 5:
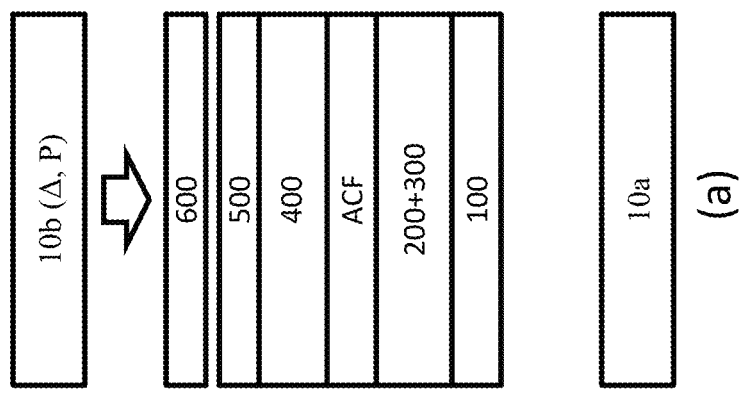

The thermal press can be conducted under conditions at 0.5 MPa~10 MPa, 100~160° C. for 3~30 sec. The thermal press can be conducted using a pressing head and a cushioning material is positioned between the pressing head and the electronic device. The cushioning material is made of polytetrafluoroethylene or silicone. Specifically, referring to FIG. 5, a schematic diagram illustrating the thermal press in the step (4) of the method of the present invention is shown. In FIG. 5, 10*a* represents a pressing head, 10*b* represents a base holder, and 600 represents a cushioning material. Heat is supplied to the pressing head 10*a* and pressure is applied to the pressing head 10*a* and the base holder 10*b*. In FIG. 5(*a*), the fabric 1*a* is shown and the other side of the base layer does not contain any adhesive layer and protective layer. In FIG. 5(*b*), the fabric 1*b* is shown and the other side of the base layer contains an adhesive layer and protective layer (separating film or paper). In FIG. 5(*c*), the fabric including a reinforcing insulating plate 51 is shown.

The thermal press can be conducted under conditions at 0.5 MPa~10 MPa, 100~160° C. for 3~30 sec and the separating film or paper is a hard separating film or paper.

Figure 6:
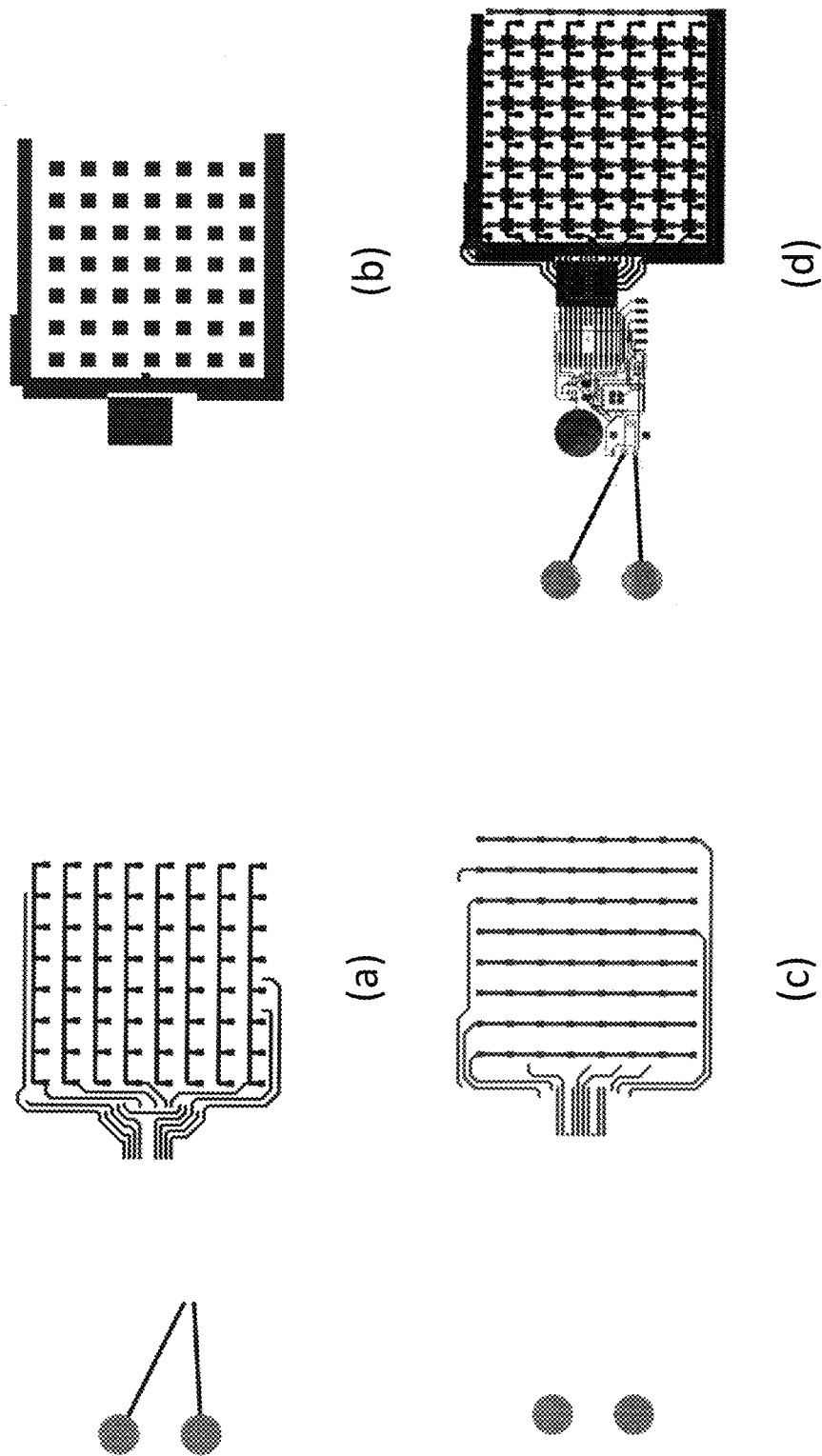
FIG. 6 shows a top-view schematic diagram illustrating a fabric having a multiple layered circuit thereon integrating with an electronic device according to one embodiment of the invention.

FIG. 6 shows a top-view schematic diagram illustrating a fabric having a multiple layered circuit thereon integrating with an electronic device according to one embodiment of the invention. The fabric having a multiple layered circuit thereon integrating with a plurality of electronic devices (LED). They can be used as a warning light or used in various display applications. FIG. 6(*a*) shows the first conductive circuit layer, FIG. 6(*b*) shows the connecting layer, FIG. 6(*c*) shows the second conductive circuit layer, FIG. 6(*d*) shows the fabric having a multiple layered circuit of the present invention after lamination of FIG. 6(*a*)~6(*c*).

In conclusion, according to the fabric having a multiple layered circuit thereon integrating with an electronic device and the method for fabricating the same of the present invention, a flexible, bendable and elastic fabric equipped with electronic devices which cannot be provided using a flexible printed circuit can be provided and besides a sticker type fabric having a multiple layered circuit thereon integrating with an electronic device can be provided and can be transferred to a desired location.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims. Each of the terms "first" and "second" is only a nomenclature used to modify its corresponding element. These terms are not used to set up the upper limit or lower limit of the number of elements.

What is claimed is:

1. A fabric having a multiple layered circuit thereon integrating with an electronic device, comprising:
   a base layer formed of a spacer fabric coated with thermoplastic resins;
   a plurality of conductive circuit layers, formed on the base layer;
   at least one connecting layer, comprising a plurality of via-holes made of a conductive material and a plurality of electrically insulated regions made of an insulating material and being positioned between any two adjacent conductive circuit layers of the plurality of conductive circuit layers wherein the via-holes electrically connect the two adjacent conductive circuit layers and the electrically insulated regions are distributed in areas other than the via-holes of the connecting layer;
   at least one electronic device, mounted on and electrically connected to a circuit of the conductive circuit layer through an anisotropic conductive film; and
   a waterproof layer, formed on the conductive circuit layer farthest away from the base layer;

wherein the anisotropic conductive film has a first surface and a second surface opposite to the first surface, the at least one electronic device is disposed on the first surface, all of the conductive circuit layers and the at least one connecting layer are disposed on the second surface and located between the anisotropic conductive film and the base layer, and at least one of the via-holes is in direct contact with one of the conductive circuit layers and in direct contact with the second surface of the anisotropic conductive film; and wherein the absolute value of the difference between the thermal expansion coefficient of the material constituting the conductive circuit layer and the thermal expansion coefficient of the insulating material constituting the electrically insulated region of the connecting layer is less than 20% of the thermal expansion coefficient of the insulating material; and the absolute value of the difference between the thermal expansion coefficient of the insulating material of the connecting layer and the thermal expansion coefficient of the conductive material of the connecting layer is less than 20% of the thermal expansion coefficient of the insulating material of the connecting layer; the absolute value of the difference between the thermal expansion coefficient of the anisotropic conductive film and the thermal expansion coefficient of the insulating material of the connecting layer is less than 20% of the thermal expansion coefficient of the insulating material of the connecting layer.

2. The fabric as claimed in claim 1, wherein the electronic device comprises a flexible circuit board and a chip or die on the flexible circuit board.

3. The fabric as claimed in claim 2, further comprising:
a reinforcing insulating plate, positioned between the flexible circuit board and the conductive circuit layer, wherein the reinforcing insulating plate is made of polyimide.

4. The fabric as claimed in claim 1, wherein the electronic device is a light emitting diode or a sensor.

5. The fabric as claimed in claim 1, wherein the base layer has one or two of its main surfaces be waterproof.

6. The fabric as claimed in claim 1, wherein the anisotropic conductive film has a bonding temperature in a range of 100~140° C.

7. The fabric as claimed in claim 1, wherein the conductive circuit layer is made of conductive silver paste.

8. The fabric as claimed in claim 1, wherein the waterproof layer is made of thermoplastic polyurethane.

9. A method for fabricating the fabric having a multiple layered circuit thereon integrating with an electronic device as set forth in claim 1, comprising the following steps:
(1) providing a base layer;
(2) forming a conductive circuit layer having a first designed pattern on the base layer;
(3) forming a connecting layer on the conductive circuit layer having the first designed pattern, wherein the connecting layer comprises a plurality of via-holes made of a conductive material and a plurality of electrically insulated regions made of an insulating material;
(4) forming a conductive circuit layer having a second designed pattern on the connecting layer and mounting at least one electronic device on a circuit of the conductive circuit layer having the second designed pattern through an anisotropic conductive film; and
(5) forming a waterproof layer;

wherein the anisotropic conductive film has a first surface and a second surface opposite to the first surface, the at least one electronic device is disposed on the first surface, all of the conductive circuit layers and the at least one connecting layer are disposed on the second surface and located between the anisotropic conductive film and the base layer, and at least one of the via-holes is in direct contact with one of the conductive circuit layers and the second surface of the anisotropic conductive film; and wherein the steps (2) and (3) are conducted at least once or after conducting the steps (2) and (3) twice or more than twice, the step (4) is conducted; and if there are more than one first designed pattern, that is, the step (2) is conducted twice or more than twice, the first designed patterns can be the same or different;

in steps (2)~(4), the absolute value of the difference between the thermal expansion coefficient of the material constituting the conductive circuit layer and the thermal expansion coefficient of the insulating material constituting the electrically insulated region of the connecting layer is less than 20% of the thermal expansion coefficient of the insulating material;

and the absolute value of the difference between the thermal expansion coefficient of the insulating material of the connecting layer and the thermal expansion coefficient of the conductive material of the connecting layer is less than 20% of the thermal expansion coefficient of the insulating material of the connecting layer; the absolute value of the difference between the thermal expansion coefficient of the anisotropic conductive film and the thermal expansion coefficient of the insulating material of the connecting layer is less than 20% of the thermal expansion coefficient of the insulating material of the connecting layer.

10. The method as claimed in claim 9, wherein in the step (2) forming a conductive circuit layer having a first designed pattern is to use silver paste to form the first designed pattern by dispensing or screen printing.

11. The method as claimed in claim 9, wherein in the step (3) forming a connecting layer is to use a three-dimensional printer to print the conductive material and insulating material simultaneously to form the via-holes and the electrically insulated regions, wherein the via-holes electrically connect the two adjacent conductive circuit layers and the electrically insulated regions are distributed in the areas other than the via-holes of the connecting layer.

12. The method as claimed in claim 9, wherein in the step (3) forming a connecting layer is to use an inkjet printing, screen printing, or dispensing method, or a coating method using a mask to form the plurality of electrically insulated regions constituted by insulating material and then to use an inkjet printing, screen printing, or dispensing method to form the plurality of via-holes constituted by silver paste or low temperature solder paste.

13. The method as claimed in claim 9, wherein in the step (4) silver paste is dispensed or screen printed to form the conductive circuit layer, and the anisotropic conductive film having low bonding temperature is used to mount the electronic device on the conductive circuit layer through thermal press.

14. The method as claimed in claim 9, wherein the electronic device comprises a flexible circuit board and a chip or die on the flexible circuit board and during the thermal press, and a reinforcing insulating plate is positioned between the flexible circuit board and the conductive circuit layer.

15. The method as claimed in claim 13, wherein the thermal press is conducted under conditions at 0.5 MPa~10 MPa, 100~160° C. for 3~30 sec.

16. The method as claimed in claim 13, wherein the thermal press is conducted using a pressing head, and a cushioning material is positioned between the pressing head and the electronic device.

17. The method as claimed in claim 9, wherein the base layer has one or two of its main surfaces be waterproof.

* * * * *